US008063689B2

(12) United States Patent
Theiler (10) Patent No.: US 8,063,689 B2
(45) Date of Patent: Nov. 22, 2011

(54) OUTPUT STAGE SYSTEM (75) Inventor: Helmut Theiler, Lieboch (AT)

(73) Assignee: Austriamicrosystems AG, Unterpremstätten (AT)

( * ) Notice: Subject to any disclaimer, the term of this patent is extended or adjusted under 35 U.S.C. 154(b) by 805 days.

(21) Appl. No.: 11/578,853

(22) PCT Filed: Apr. 21, 2005

(86) PCT No.: PCT/EP2005/004308
§ 371 (c)(1),
(2), (4) Date: Jan. 18, 2007

(87) PCT Pub. No.: WO2005/104370
PCT Pub. Date: Nov. 3, 2005

(65) Prior Publication Data
US 2007/0273428 A1    Nov. 29, 2007

(30) Foreign Application Priority Data
Apr. 21, 2004  (DE) .......................... 10 2004 019 345

(51) Int. Cl.
*H03L 5/00*    (2006.01)
(52) U.S. Cl. ............. 327/333; 327/436; 326/63; 326/68; 326/80; 326/81
(58) Field of Classification Search .................. 327/333, 327/436; 326/63, 68, 80, 81
See application file for complete search history.

(56) References Cited

U.S. PATENT DOCUMENTS

| | | | | |
|---|---|---|---|---|
| 5,191,233 A | * | 3/1993 | Nakano | 327/333 |
| 5,296,755 A | * | 3/1994 | Miyamoto et al. | 326/119 |
| 5,300,832 A | * | 4/1994 | Rogers | 326/57 |
| 5,365,126 A | * | 11/1994 | Krenik et al. | 326/83 |
| 6,018,272 A | * | 1/2000 | Marsh et al. | 330/307 |
| 6,104,277 A | * | 8/2000 | Iniewski et al. | 338/311 |
| 6,380,766 B2 | * | 4/2002 | Savord | 327/108 |
| 6,717,451 B1 | * | 4/2004 | Klein et al. | 327/333 |
| 6,731,151 B1 | * | 5/2004 | Doutreloigne | 327/333 |

(Continued)

FOREIGN PATENT DOCUMENTS

DE    101 46 900    4/2003

(Continued)

OTHER PUBLICATIONS

English translation of International Preliminary Examination Report for PCT/EP2005/004308.

(Continued)

*Primary Examiner* — Lincoln Donovan
*Assistant Examiner* — Adam Houston
(74) *Attorney, Agent, or Firm* — Fish & Richardson P.C.

(57) ABSTRACT

An output stage includes a system input and a system output, a first transistor having a first control input and a first controlled path, and a second transistor having a second control input and a second controlled path. The second controlled path is in series with the first controlled path and the system output. A first current-controlled voltage source has an input that is electrically connected to the system input. The first current-controlled voltage source has an output that is electrically connected to the first control input of the first transistor. A second current-controlled voltage source has an input that is electrically connected to the system input. The second current-controlled voltage source has an output that is electrically connected to the second control input of the second transistor.

30 Claims, 3 Drawing Sheets

U.S. PATENT DOCUMENTS

| | | | |
|---|---|---|---|
| 7,655,992 B2 * | 2/2010 | Takahashi et al. | 257/409 |
| 7,791,852 B2 * | 9/2010 | Otsuka et al. | 361/56 |
| 2008/0042686 A1 * | 2/2008 | Otsuka et al. | 326/30 |
| 2009/0152643 A1 * | 6/2009 | Huang et al. | 257/370 |

FOREIGN PATENT DOCUMENTS

| | | |
|---|---|---|
| EP | 0 660 415 | 6/1995 |
| EP | 1 326 337 | 7/2003 |

OTHER PUBLICATIONS

International Search Report for PCT/EP2005/004308 dated Apr. 21, 2005.
Written Opinion for PCT/EP2005/004308 dated Apr. 21, 2005.
International Preliminary Examination Report for PCT/EP2005/004308.
Examination report for German Application No. 10 2004 019 345.2.

* cited by examiner

FIG 2

OUTPUT STAGE SYSTEM

TECHNICAL FIELD

This patent application describes an output stage system.

BACKGROUND

In large scale integrated circuits it is often desirable to be able to output by means of an output stage an output voltage whose voltage swing exceeds the actual supply voltage of the respective semiconductor circuit technology and/or the rated voltage of the transistors respectively provided. Modern CMOS, complementary metal oxide semiconductor, circuit technologies, for example, have supply voltages of 3.6 V or less.

The constantly decreasing thickness of the gate oxide in CMOS circuits with the aim of utilizing the silicon area in a highly efficient manner leads to ever further reduced supply voltages. On the other hand, output voltages 3.6V or less often do not suffice for driving sensors or actuators directly with an output stage of the integrated circuit.

A common possibility for solving this problem is provided by means of so-called open-drain or open-collector outputs to which external pull-up resistors or on-chip pull-up resistors are connected in order to form an output stage.

In n-channel MOS structures, open-drain outputs can be realized via so-called NMOSH (High Voltage n-Type Metal Oxide Semiconductor) components, which are distinguished by suitability for comparatively high voltages. For this purpose, NMOSH components normally have weakly doped n-type well regions used as drain regions and are provided with an additional field oxide region for enlarging the gate oxide at the drain edge of the channel.

Since, in the conventional MOS circuit technologies, separate p-type wells in n-type well regions are not available for creating a corresponding p-type drain region, a complementary solution to NMOSH components is not available for p-channel components. In p-channel components with connected source and n-type well terminals which are produced in integrated circuit technology by means of a typical 3.3V fabrication process, the following maximum permissible voltages accordingly hold true: the source voltage with respect to gate voltage max. 3.6V, gate voltage with respect to drain voltage max. 3.6V, source voltage with respect to drain voltage max. 3.6V, source and n-type well voltage with respect to p-type substrate maximum 15V.

The passive pull-up components described have the disadvantage that a comparatively large amount of current is wasted if the resistance values of the pull-up resistors are low. On the other hand, the edge steepness of the rising edge is greatly limited in the case of larger resistances.

A similar problem area arises for analog outputs, where an external driver stage in a different fabrication technology has to be used to obtain the desired voltage swing at the output. In order for example to drive a high-voltage NMOS switch that can switch a voltage of up to 600V, a gate voltage of 10V is typically necessary in order to ensure a good switch-on state.

External driver stages are used for providing an analog output voltage having a voltage swing that is to say a dynamic amplitude, of 7V, as is provided in modern so-called power line modem applications. In this case, the integrated circuit has a differential output stage connected to the actual output via an external current mirror formed in bipolar circuit technology.

The document EP 1 326 337 A1 shows a push-pull driver for high voltages that is realized in standard CMOS. An upper, a middle and a lower transistor form a series circuit. In this case, diodes are provided which, together with a clamping voltage effect a clamping of the gates of the middle and lower transistors.

SUMMARY

The output stage system proposed comprises at least two transistors which are connected up in a series circuit with regard to their controlled paths and are separated from one another by integration in respective n-type well regions. One of the two terminals of the series circuit forms the output of the output stage system. Connected to control inputs of the transistors is a respective current-controlled voltage source for controlling the respective transistor. Input terminals of the current-controlled voltage sources are coupled to the input of the output stage system. N-type well regions are preferably decoupled from one another in potential terms.

By virtue of dividing the output transistor into a plurality of partial transistors connected up in series with one another and operating said transistors under similar conditions in each case by means of the current-controlled voltage sources, it is possible to provide at the output of the output stage system a voltage swing which is greater than the actual rated voltage of the respective fabrication process or of the respective standard circuit technology in which the output stage system is integrated or constructed.

To stay with the numerical example mentioned in the introduction for a typical 3.3V process, this means that on account of the restriction of max. 15V between n-type well and source terminals and p-type substrate expediently up to five transistors are connected in series by their controlled paths.

That terminal of the series circuit of the controlled paths of the transistors which does not form the output of the output stage system is preferably connected to a supply potential terminal.

The supply voltage that can be fed at the supply potential terminal is preferably and advantageously greater than the respective maximum permissible voltage across the controlled path of the individual transistors.

As an alternative or in addition, the supply voltage that can be fed at the supply potential terminal is greater than the voltage swing or a signal that can be fed at the input of the output stage system.

Preferably, a respective controlled current source is assigned to the first and to the second current-controlled voltage source and connected thereto for coupling the current-controlled voltage sources to the input of the output stage system.

In this case, the current sources and the current-controlled voltage sources assigned thereto are advantageously designed such that the same control voltage is applied, in each case in relative terms, to the transistors which are connected up in the series circuit.

In this case, however, when considered in absolute terms each transistor is at a different potential with regard to its control voltage.

The currents output by the controlled current sources are furthermore preferably of identical magnitude in each case.

The controlled current sources are preferably controlled depending on a signal that can be fed at the input such that the current-controlled voltage sources either switch the transistors in the series circuit on and off or cause them to generate an analog voltage signal in an analog operating mode. The output signal here is in each case dependent on the input signal of the output stage system.

In order to be able to operate the current-controlled voltage sources at high voltage levels, it is advantageous for each of the controlled current sources to be assigned a respective cascode stage.

As revealed by simulations, it is advantageous, particularly in that state of the output stage system in which the transistors connected up in series are switched off, for a respective resistor to be connected in parallel with each controlled path. In this case, the resistors themselves are preferably likewise connected up to one another in a series circuit. The resistor chain is preferably arranged between supply potential terminal and output of the output stage system and has the effect that, as a result of the defined current through the resistors, which are preferably of identical magnitude in each case, an identical voltage drop across each of the transistors leads to a homogeneous potential distribution.

Accordingly, the resistors act like additional bias resistors which afford additional protection of the transistors against overvoltage.

In this case, the resistors preferably have identical resistance values and are embodied with a high resistance in order to keep the power loss low.

In order to form a complementary output stage system in one advantageous development, a complementary transistor with respect to the conductivity of the first and second transistors is provided, having a controlled path connected between the output of the output stage system and a reference potential terminal.

A complementary transistor is preferably an n-channel MOS transistor designed for high voltages, a so-called NMOSH component.

The first and the second and also further transistors possibly provided which are arranged in a series circuit between supply potential and output are preferably of a p-conductivity type.

The current-controlled voltage sources are preferably connected up to the transistor respectively assigned to them such that all transistors of the series circuit are at the same operating point in each case.

Particularly when the transistors are embodied as unipolar transistors, the driving thereof with the current-controlled voltage sources is preferably embodied such that the p-channel transistors are in each case exposed to the same gate-source voltage.

The transistors of the series circuit furthermore preferably have the same geometry, that is to say in particular the same channel length and channel width in each case. If, in addition, the drain currents and the impedances of the transistors are also identical in each case, then the drain-source voltage across each transistor of the series circuit may advantageously be identical in each case.

The more exactly it is possible to effect a homogeneous potential distribution over the controlled paths of the transistors of the series circuit, the higher the supply voltage of said transistors and thus also the voltage swing of the signal at the output may be.

Each transistor of the output stage is preferably arranged in a respective separate n-type well. Even more preferably, the respective transistor together with the current-controlled voltage source respectively assigned to it is in each case arranged jointly in an n-type well respectively separate from the rest of the source/transistor pairs.

The current-controlled voltage sources which drive the transistors of the series circuit are preferably each embodied as a resistor. In this case, the resistors are chosen such that by feeding a controlled current to each of the resistors, an identical voltage in each case is dropeed across the resistors.

In this case, the resistors are preferably respectively connected between source and gate terminals of the transistors of the series circuit.

The gate terminal of the transistors is preferably in each case connected to a respective current-controlled voltage source.

In an alternative embodiment, the current-controlled voltage sources are each formed as a transistor connected up in each case as a diode. In this case, a transistor connected up as a diode together with a respective assigned transistor of the series circuit in each case forms a respective current mirror. Each current mirror is preferably driven by a respective controlled current source.

Even more preferably, an operational amplifier is provided, which is connected to the input of the output stage system by at least one input and is coupled to the current mirror on the output side. This development of the principle proposed is suitable particularly for providing analog output signals.

The output stage system described is preferably embodied in integrated circuit technology. The output stage system proposed is particularly suitable for integration in a complementary metal oxide semiconductor fabrication method.

DESCRIPTION OF THE DRAWINGS

In the figures.

Identical reference symbols designate identical or identically acting parts.

DETAILED DESCRIPTION

Figure 1:
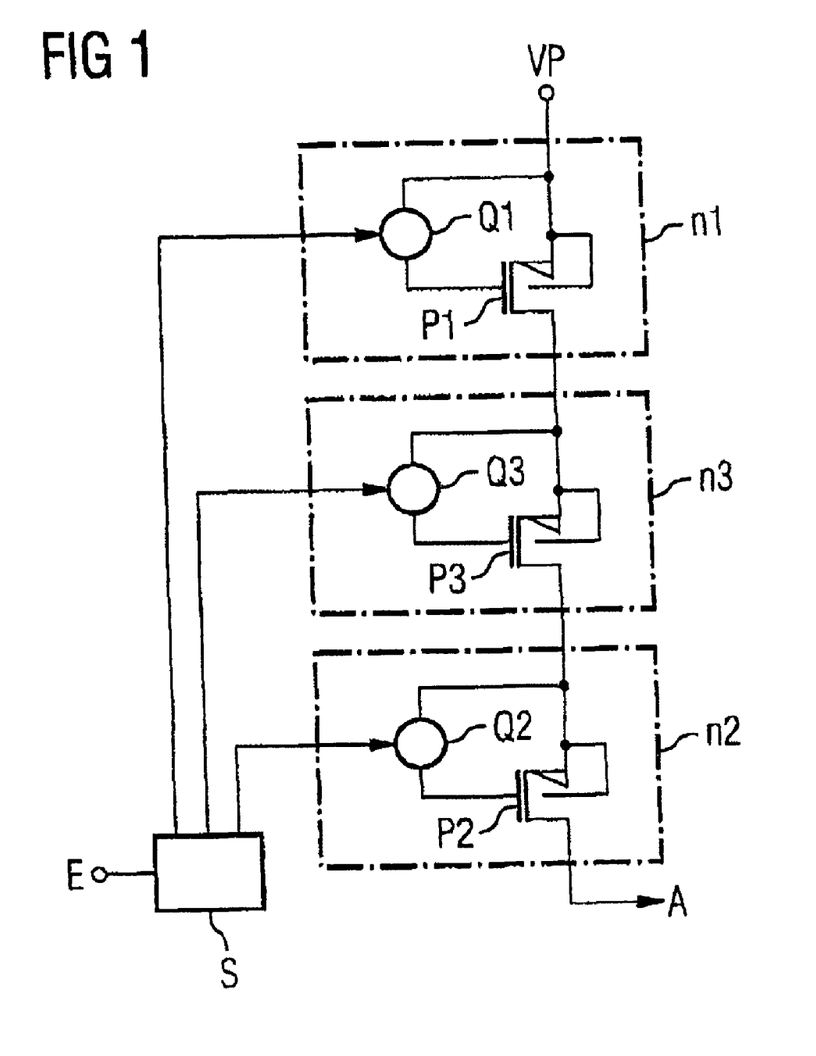
FIG. 1 shows a first exemplary embodiment of an output stage system according to the principle proposed.

FIG. 1 shows an output stage system having an input E and an output A. A series circuit comprising three transistors P1, P2, P3 is arranged between a supply potential terminal VP and the output A. The transistors P1, P2, P3 are each embodied as a p-channel MOS transistor. The three transistors P1, P2, P3 each have a gate terminal as control terminal, and each have a source terminal and a drain terminal as terminals of their controlled paths, the source terminal in each case being connected to the mutually separated n-type well regions n1, n2, n3 in which the transistors P1, P2, P3 are integrated. The source terminal of the first transistor P1 is connected to the supply potential terminal VP. The drain terminal of the first transistor P1 is connected to the source terminal of the third transistor P3, the drain terminal of which is connected to the source terminal of the second transistor P2, the drain terminal of which in turn is connected to the output A. Each transistor P1, P2, P3 is assigned a respective current-controlled voltage source Q1, Q2, Q3. The assigned current-controlled voltage source Q1, Q2, Q3 is respectively connected between gate terminal and source terminal of the respective transistors P1, P2, P3. The input E is coupled to respective control inputs of the current-controlled voltage sources Q1, Q2, Q3 via a control unit S, the control unit providing respective output currents at different potentials. Each transistor P1, P2, P3 is arranged with the current-controlled voltage source Q1, Q2, Q3 respectively assigned to it jointly in a respective separate n-type well n1, n2, n3 in integrated circuit technology in a p-predoped substrate.

The transistors P1, P2, P3 form an active pull-up structure driven by a controller S, Q1, Q2, Q3. The p-channel transistors each have identical dimensions and are driven such that their gate-source voltage is identical in each case. On account of the identical size, the identical gate-source voltage and approximately the same drain current, the impedance for all these series components P1, P2, P3 is practically identical. With identical impedance of the transistors P1, P2, P3, the drain-source voltage respectively dropped across them is likewise identical. The high voltage dropped across the series circuit of the transistors P1, P2, P3 is accordingly divided by the number of transistors used in series. This means that in the present example of three transistors, triple the voltage of the maximum operating voltage of an individual transistor can be held. In the present example, a safety margin is also taken into account since a not totally ideal identity of the impedances of the transistors can occur on account of mismatches and fabrication variations of mass production.

Conventional p-channel structures available in CMOS fabrication processes may advantageously be used as p-channel transistors. It is nevertheless possible, according to the principle proposed, to tap off at the output A a voltage corresponding to a multiple of the maximum permissible operating or rated voltage of the respective integration process.

For providing the control currents, the control unit S preferably comprises NMOS transistors designed for high voltages.

An additional advantage of the system described is that a high voltage swing at the output and good driver properties can be obtained in conjunction with low power losses and without requiring external components. The circuit can be completely integrated with conventionally available fabrication processes.

Figure 2:
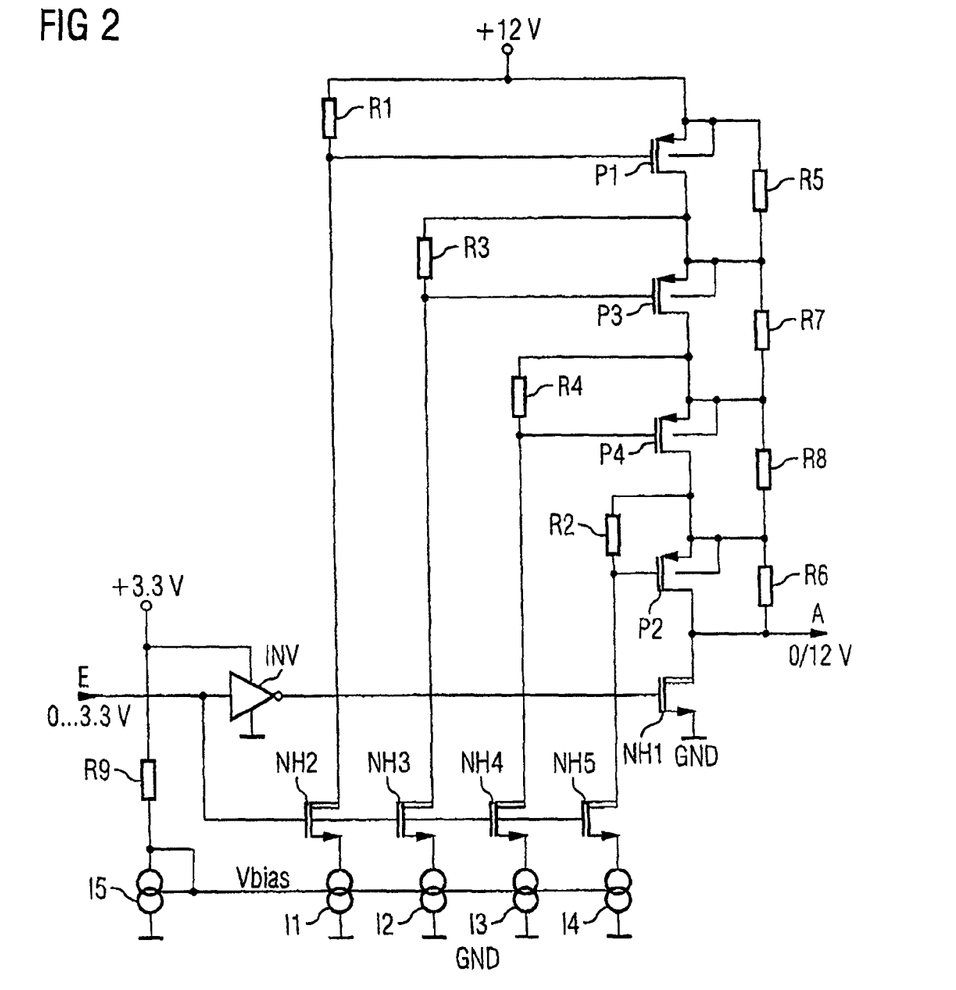
FIG. 2 shows a development of the output stage system from FIG. 1 using an example with a digital output.

FIG. 2 shows a development of the principle of an output stage system in accordance with FIG. 1. The circuit in accordance with FIG. 2 is designed for a high voltage swing at the output A and is formed as a digital push-pull output stage. The push-pull output stage is suitable for an operating voltage of 12V and permits a changeover to somewhere between a low state of 0V and a high state of 12V at the output.

A total of four series-connected transistors P1, P2, P3, P4 are provided, which are connected up to one another in series analogously to the transistors of FIG. 1. An n-channel transistor NH1 designed for high voltages is additionally provided, the controlled path of which is connected between the output A and a reference potential terminal GND. In the circuit, respective resistors R1, R2, R3, R4 are used as current-controlled voltage sources, said resistors respectively being connected between source terminal and gate terminal of the assigned transistor P1 to P4. Moreover, the gate terminal of the transistors P1 to P4 is connected via a respective cascode stage NH2, NH3, NH4, NH5 to a load terminal of a respective controlled current source I1, I2, I3, I4. The controlled current sources I1, I2, I3, I4 are furthermore connected to the reference potential terminal GND. The control inputs of the controlled current sources I1 to I4 are connected to one another and combined in a bias voltage node VBIAS. A current source I5 connected up as a diode together with the controlled current sources I1 to I4 forms a respective current mirror. The current is defined by a resistor R9 and the current mirror ratios, the resistor R9 being connected between a supply potential terminal for a low supply voltage of 3.3V and a current source 15 connected up as a diode. The cascode stages NH2, NH3, NH4, NH5 are each formed as n-channel transistors which are suitable for high voltage and the gate terminals of which are connected to one another and to the input E of the system. The input E of the system is further-more connected to the gate terminal of the complementary transistor NH1 via an inverter INV, which is likewise connected to the supply potential terminal for a low supply voltage of 3.3V. Accordingly, the circuit in accordance with FIG. 2 converts a digital input signal having a voltage swing of 0 to 3.3V into a digital signal having a swing of 12V, merely conventional p-channel transistors being required as components of the p conductivity type.

The p-channel transistors P1 to P4 have a respective assigned bias resistor R5 to R8 respectively connected in parallel with the controlled path. In the state when the p-channel transistors P1 to P4 are turned off, a homogeneous potential distribution can be ensured by means of the resistors R5 to R8. In this case, the resistors R5 to R8 serve as an additional safety measure and may also be omitted in alternative embodiments.

The transistors P1 to P4 are thin oxide p-channel components which, introduced in respective separate n-type wells, are insulated from one another.

The structure proposed enables a homogenous potential distribution over the entire series circuit and, in particular, identical voltage drops across the controlled paths of the transistors P1 to P4 independently of the operating state or the operating point. This means that the 12V supply voltage of the example leads to a maximum voltage drop of 12V divided by 4 gives 3V across each p-channel component. The p-channel transistors are switched off by means of the resistors R1 to R4 respectively between gate and source. In order to switch on the p-channel transistors P1 to P4, each of the resistors R1 to R4 is fed a controlled current which in turn has the effect that a respective identical voltage is dropped across the resistors R1 to R4. As a result, an identical gate-source voltage is provided for each p-channel transistor P1 to P4, so that the impedances of all the p-channel transistors P1 to P4 match one another. On account of these identical impedance values, the drain-source voltage for the p-channel transistors will also be identical independently of the operating point.

In the present case, the number of p-channel transistors P1 to P4 is defined by the ratio of the desired voltage at the output and the maximum operating voltage of the transistors. If the voltage swing at the output merely corresponds to double the maximum operating voltage, it is possible, of course, to use a configuration having just two transistors P1, P2. This correspondingly applies to other voltage ratios and applications.

Figure 3:
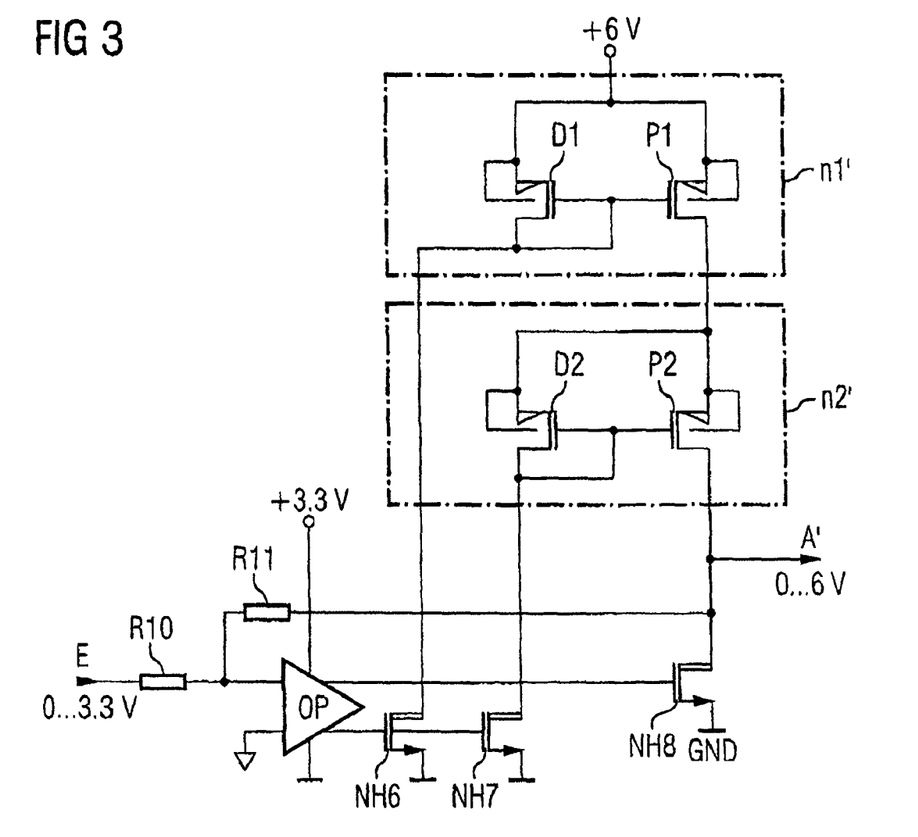
FIG. 3 shows a further exemplary embodiment of an output stage system according to the principle proposed with an analog signal output.

FIG. 3 shows a third exemplary embodiment of an output stage system according to the principle proposed on the basis of a development for an analog signal output at which, in the example proposed, a continuously adjustable voltage of between 0 and 6V can be tapped off. A series circuit comprising a first transistor P1 and a second transistor P2 is arranged between the supply potential terminal for 6V and the output A', The transistors P1, P2 are in each case the output transistors of a current mirror which they form with a respective assigned diode D1, D2. The diodes D1, D2 are likewise formed as p-channel MOS transistors. The drain terminals of the diodes D1, D2 are connected to a respective n-channel transistor NH6, NH7 which is suitable for high voltage. Said transistors NH6, NH7 serve as controlled current sources for feeding the current mirrors D1, P1; D2, P2. Analogously to FIG. 2 a complementary transistor NH8 is connected between the output A' and the reference potential terminal GND. The control inputs of the complementary transistor NH8 on the one hand, and of the two current source transistors NH6, NH7, on the other hand, are connected to a respective terminal of a fully differential output stage of an operational amplifier OP. The operational amplifier OP is operated with a voltage of only 3.3V. The operational amplifier has a differential input, of which one terminal is connected via a resistor R10 to the input E of the system and a further terminal is connected to a fixed potential. Moreover, a feedback resistor R11 is connected between the output A' of the output stage system and that input of the operational amplifier which is coupled to the input E via the resistor R10.

Each current mirror D1, P1; D2, P2 is formed in a respective separate n-type well. The desired voltage division between the series transistors P1, P2 is obtained in the present case by driving the current mirrors D1, P1; D2, P2 with a respective current of identical value. If, in the case of an analog output of this type, the current through the transistors P1, P2 is never entirely turned off, the resistors R5 to R8 from FIG. 2 are not required.

The circuit of FIG. 3 has the same advantages as those of FIGS. 1 and 2 and is additionally suitable for outputting an analog signal which follows the value at the input E and is proportional to said value. A dynamic range of the amplitude of 0 to 6 volts is achieved at the output A'. A signal having a voltage switch of 0 to 3.3V is fed in at the input E.

In addition to the exemplary applications shown the output stage system proposed is also suitable as an on-chip voltage regulator. In particular, the principle proposed makes it possible to operate a serial USB, universal serial bus terminal with a voltage of 5V from a 3.3 v or 2.5V CMOS circuit. An example of a further field of application is on-chip driver circuits for external power MOS switches with a high threshold.

All the exemplary embodiments shown manage entirely without external components and can advantageously be integrated completely in each case in a common integrated circuit.

The invention claimed is:

1. An output stage comprising:
a system input and a system output;
a first transistor having a first control input and a first controlled path;
a second transistor having a second control input and a second controlled path, the second controlled path being in series with the first controlled path and the system output;
a first current-controlled voltage source having an input, the first current-controlled voltage source having an output that is electrically connected to the first control input of the first transistor;
a second current-controlled voltage source having an input, the second current-controlled voltage source having an output that is electrically connected to the second control input of the second transistor;
wherein the first transistor and the first current-controlled voltage source are in a first n-type well, and wherein the second transistor and the second current-controlled voltage source are in a second n-type well that is separate from the first n-type well; and
current sources that are electrically couplable to the first current-controlled voltage source and to the second current-controlled voltage source and to the system input.

2. The output stage of claim 1, wherein a terminal of the first controlled path is electrically connected to a supply potential terminal.

3. The output stage of claim 2, wherein a supply voltage at the supply potential terminal is greater than a maximum permissible voltage across the first controlled path.

4. The output stage of claim 1, wherein the current sources correspond to cascode stages.

5. The output stage of claim 1, further comprising:
resistors in parallel with the first and second controlled paths.

6. The output stage of claim 1, further comprising:
a complementary transistor having a third controlled path between the system output and a reference potential terminal.

7. The output stage of claim 6, wherein a signal at the system input drives the complementary transistor.

8. The output stage of claim 1, wherein the first current-controlled voltage source comprises first load terminals and the second current-controlled voltage source comprises second load terminals, the first load terminals being electrically connected between gate and source terminals of the first transistor, the second load terminals being electrically connected between gate and source terminals of the second transistor; and
wherein a gate-source voltage of the first transistor is substantially equal to a gate-source voltage of the second transistor.

9. The output stage of claim 1, wherein the first and second transistors comprise unipolar transistors having a p conductivity type.

10. The output stage of claim 1, wherein the first and second transistors are parts of an integrated circuit and are in separate n-type wells that are insulated from one another.

11. The output stage of claim 1, wherein the first and second transistors have substantially identical impedances.

12. The output stage of claim 1, wherein the first and second transistors have substantially identical geometric dimensions.

13. The output stage of claim 1, wherein the first current-controlled voltage source and the second current-controlled voltage source each comprise a resistor.

14. The output stage of claim 1, wherein the first current-controlled voltage source comprises a transistor which, together with the first transistor, comprises a first current mirror; and
wherein the second current-controlled voltage source comprises a transistor which, together with the second transistor, comprises a second current mirror.

15. The output stage of claim 14, further comprising:
an operational amplifier having an input that is electrically connected to the system input, the operational amplifier having an output that is electrically connected to the first and second current mirrors.

16. The output stage of claim 1, wherein the first and second current-controlled voltage sources operate at different potentials.

17. The output stage of claim 1, further comprising:
a third transistor having a third control input electrically connected to a third current-controlled voltage source, the third transistor having a third controlled path in series between the first and second controlled paths.

18. The output stage of claim 1 formed using integrated circuit technology.

19. The output stage of claim 1 formed using metal oxides semiconductor circuit technology.

20. An output stage comprising:
a system input and a system output;
M (M>1) transistors, each transistor having a control input and a controlled path, each controlled path being in series with other controlled paths and the system output;
M current-controlled voltage sources, each current-controlled voltage sources having an input, each current-controlled voltage source having an output that is electrically connected to a control input of a corresponding transistor;

wherein each M$^{th}$ transistor and corresponding M$^{th}$ current-controlled voltage source are in a same n-type well that is separate from other n-type wells containin others of the M transistors and corresponding M current-controlled voltage sources; and M current sources that are electrically couplable to the M current-controlled voltage sources and to the system input.

21. An output stage comprising:

a system input and a system output;

a first transistor having a first control input and a first controlled path;

a second transistor having a second control input and a second controlled path, the second controlled path being in series with the first controlled path and the system output;

a first current-controlled voltage source having an input, the first current-controlled voltage source having an output that is electrically connected to the first control input of the first transistor;

a second current-controlled voltage source having an input, the second current-controlled voltage source having an output that is electrically connected to the second control input of the second transistor;

wherein the first transistor and the first current-controlled voltage source are in a first n-type well and wherein the second transistor and the second current-controlled voltage source are in a second n-type well, the first n-type well being separated and insulated from the second n-type well; and current sources that are electrically couplable to the first current-controlled voltage source and to the second current-controlled voltage source and to the system input.

22. An output stage comprising:

a system input and a system output;

a first transistor having a first control input and a first controlled path;

a second transistor having a second control input and a second controlled path, the second controlled path being in series with the first controlled path and the system output;

a first current-controlled voltage source having an input, the first current-controlled voltage source having an output that is electrically connected to the first control input of the first transistor;

a second current-controlled voltage source having an input, the second current-controlled voltage source having an output that is electrically connected to the second control input of the second transistor;

wherein the first transistor and the first current-controlled voltage source are in a first n-type well and wherein the second transistor and the second current-controlled voltage source are in a second n-type well that is separate from the first n-type well, the first transistor having a first source terminal and a first drain terminal across the first controlled path, the second transistor having a second source terminal and a second drain across terminal the second controlled path; and current sources that are electrically couplable to the output of the first current-controlled voltage source and to the output of the second current-controlled voltage source and to the system input.

23. The output stage of claim 1, wherein the first transistor and the second transistors have approximately same: sizes, gate-source voltages, and drain currents.

24. The output stage of claim 1, wherein the first transistor and the second transistors have approximately same impedances.

25. The output stage of claim 20, wherein the M transistors have approximately same: sizes, gate-source voltages, and drain currents.

26. The output stage of claim 20, wherein the M transistors have approximately same impedances.

27. The output stage of claim 21, wherein the first transistor and the second transistors have approximately same: sizes, gate-source voltages, and drain currents.

28. The output stage of claim 21, wherein the first transistor and the second transistors have approximately same impedances.

29. The output stage of claim 22, wherein the first transistor and the second transistors have approximately same: sizes, gate-source voltages, and drain currents.

30. The output stage of claim 22, wherein the first transistor and the second transistors have approximately same impedances.

* * * * *

UNITED STATES PATENT AND TRADEMARK OFFICE
CERTIFICATE OF CORRECTION

| | | |
|---|---|---|
| PATENT NO. | : 8,063,689 B2 | Page 1 of 1 |
| APPLICATION NO. | : 11/578853 | |
| DATED | : November 22, 2011 | |
| INVENTOR(S) | : Theiler | |

It is certified that error appears in the above-identified patent and that said Letters Patent is hereby corrected as shown below:

Column 9, Claim 20, Line 6
Delete "containin" and Insert -- containing --

Column 9, Claim 21, Line 30
Delete "well" and Insert -- well, --

Column 10, Claim 22, Line 10
Delete "well" and Insert -- well, --

Column 10, Claim 22, Line 16
Delete "across terminal" and Insert -- terminal across --

Signed and Sealed this
Twenty-eighth Day of February, 2012

David J. Kappos
*Director of the United States Patent and Trademark Office*